(12) United States Patent  
Chung et al.

(10) Patent No.: US 8,331,084 B2  
(45) Date of Patent: Dec. 11, 2012

(54) APPARATUS FOR SECURING ELECTRONIC EQUIPMENT

(75) Inventors: Wing Yeung Chung, Erie, PA (US); Gerard Michael Cafferty, Erie, PA (US)

(73) Assignee: General Electric Company, Schenectady, NY (US)

( * ) Notice: Subject to any disclaimer, the term of this patent is extended or adjusted under 35 U.S.C. 154(b) by 273 days.

(21) Appl. No.: 12/779,285

(22) Filed: May 13, 2010

(65) Prior Publication Data

US 2011/0279965 A1    Nov. 17, 2011

(51) Int. Cl.
G06F 1/16       (2006.01)
H05K 5/00      (2006.01)
H05K 7/00      (2006.01)

(52) U.S. Cl. ............................. 361/679.34; 361/679.41
(58) Field of Classification Search ... 361/67.33–679.45
See application file for complete search history.

(56) References Cited

U.S. PATENT DOCUMENTS

| | | | |
|---|---|---|---|
| 4,831,476 A * | 5/1989 | Branc et al. ............ | 360/99.15 |
| 4,833,554 A * | 5/1989 | Dalziel et al. ............ | 360/98.04 |
| 4,979,062 A * | 12/1990 | Stefansky et al. ......... | 360/97.13 |
| 4,980,786 A * | 12/1990 | O'Sullivan et al. ....... | 360/99.18 |
| 5,121,295 A * | 6/1992 | Lam ........................ | 361/679.33 |
| 5,281,150 A * | 1/1994 | Bundga et al. ............ | 439/67 |
| 5,541,787 A * | 7/1996 | Jabbari et al. ............ | 360/99.16 |
| 5,668,697 A * | 9/1997 | Dowdy ................... | 361/679.34 |
| 5,673,171 A * | 9/1997 | Varghese et al. ......... | 361/679.34 |
| 5,703,734 A * | 12/1997 | Berberich et al. ........ | 360/99.18 |
| 5,737,541 A | 4/1998 | Shimiu et al. | |
| 5,751,548 A | 5/1998 | Hall et al. | |
| 5,760,998 A * | 6/1998 | Berberich et al. ........ | 360/99.18 |
| 5,797,667 A * | 8/1998 | Wu ......................... | 312/332.1 |
| 5,868,261 A * | 2/1999 | Collins et al. ............ | 211/26 |
| 5,886,869 A * | 3/1999 | Fussell et al. ............ | 361/679.31 |
| 6,015,196 A * | 1/2000 | Welch et al. ............. | 312/223.2 |
| 6,108,163 A * | 8/2000 | Boutaghou ............... | 360/99.18 |
| 6,166,901 A | 12/2000 | Gamble et al. | |
| 6,233,143 B1 | 5/2001 | Gamble et al. | |
| 6,320,744 B1 * | 11/2001 | Sullivan et al. ........... | 361/679.34 |
| 6,456,491 B1 * | 9/2002 | Flannery et al. .......... | 361/679.33 |

(Continued)

FOREIGN PATENT DOCUMENTS

EP            01993058         11/2008

(Continued)

OTHER PUBLICATIONS

PCT International Search Report issued in WO/PCT/US2010/057352 on Mar. 7, 2011.

*Primary Examiner* — Adrian S Wilson

(74) *Attorney, Agent, or Firm* — GE Global Patent Operation; John A. Kramer

(57) ABSTRACT

An apparatus for securing electronic equipment. The apparatus includes an electronic device having a first mating portion. The device is removably secured within a shell, which has an open end allowing access to the first mating portion. The apparatus further includes a dock having a second mating portion and an output connector in electrical communication with the second mating portion. The dock removably receives the shell to facilitate electrical communication between the first and second mating portions. The output connector facilitates electrical communication between the electronic device and a device external to the dock. The apparatus also includes a damping mechanism to reduce vibratory forces on the first and second mating portions and relative movement between the portions.

20 Claims, 9 Drawing Sheets

U.S. PATENT DOCUMENTS

| | | | |
|---|---|---|---|
| 6,496,362 B2 * | 12/2002 | Osterhout et al. | 361/679.34 |
| 6,618,246 B2 * | 9/2003 | Sullivan et al. | 361/679.46 |
| 6,761,580 B2 * | 7/2004 | Chang | 439/502 |
| 6,839,228 B2 * | 1/2005 | Choi | 361/679.33 |
| 6,843,674 B1 | 1/2005 | Young | |
| 6,867,942 B2 * | 3/2005 | Albrecht et al. | 360/69 |
| 6,967,833 B2 * | 11/2005 | Boykin et al. | 361/679.33 |
| 7,079,380 B2 * | 7/2006 | Wubs | 361/679.35 |
| 7,113,398 B2 * | 9/2006 | Oba et al. | 361/679.37 |
| 7,360,713 B2 * | 4/2008 | Nishizawa et al. | 235/492 |
| 7,379,294 B2 | 5/2008 | Chen | |
| 7,382,610 B2 * | 6/2008 | Lin et al. | 361/679.33 |
| 7,495,902 B2 | 2/2009 | Connelly, Jr. et al. | |
| 7,548,418 B2 * | 6/2009 | Martin et al. | 361/679.37 |
| 7,656,655 B2 * | 2/2010 | Fan et al. | 361/679.34 |
| 7,729,107 B2 * | 6/2010 | Atkins et al. | 361/679.02 |
| 8,050,026 B2 * | 11/2011 | Chang | 361/679.33 |
| 2001/0031578 A1 * | 10/2001 | Usui et al. | 439/607 |
| 2004/0023522 A1 * | 2/2004 | Chang | 439/43 |
| 2004/0032711 A1 * | 2/2004 | Kaczeus et al. | 361/685 |
| 2004/0042244 A1 | 3/2004 | Kim et al. | |
| 2004/0070926 A1 * | 4/2004 | Boykin et al. | 361/683 |
| 2005/0013107 A1 | 1/2005 | Desai et al. | |
| 2005/0117249 A1 * | 6/2005 | Spychalla | 360/98.04 |
| 2005/0225039 A1 * | 10/2005 | Seki et al. | 277/637 |
| 2006/0044674 A1 * | 3/2006 | Martin et al. | 360/97.01 |
| 2006/0052006 A1 | 3/2006 | Amano et al. | |
| 2006/0158860 A1 * | 7/2006 | Green et al. | 361/727 |
| 2006/0181845 A1 * | 8/2006 | Shah et al. | 361/685 |
| 2007/0086156 A1 * | 4/2007 | Skinner | 361/685 |
| 2007/0263351 A1 * | 11/2007 | Ho et al. | 361/685 |
| 2008/0037211 A1 * | 2/2008 | Martin et al. | 361/685 |
| 2008/0057781 A1 | 3/2008 | Chen et al. | |
| 2008/0101006 A1 * | 5/2008 | Tsorng et al. | 361/685 |
| 2008/0101007 A1 * | 5/2008 | Tsorng et al. | 361/685 |
| 2008/0116774 A1 * | 5/2008 | Chen et al. | 312/223.2 |
| 2008/0158808 A1 * | 7/2008 | Camarena et al. | 361/685 |
| 2008/0158810 A1 * | 7/2008 | Liu et al. | 361/685 |
| 2008/0225494 A1 * | 9/2008 | Yang | 361/727 |
| 2008/0239651 A1 | 10/2008 | Curnalia et al. | |
| 2008/0310096 A1 * | 12/2008 | Sandesara et al. | 361/685 |
| 2010/0118440 A1 * | 5/2010 | Qu et al. | 360/133 |

FOREIGN PATENT DOCUMENTS

| | | |
|---|---|---|
| EP | 2052389 | 4/2009 |
| WO | 2009129466 | 10/2009 |

* cited by examiner

APPARATUS FOR SECURING ELECTRONIC EQUIPMENT

FIELD OF THE INVENTION

Embodiments of the invention relate generally to an apparatus for securing electronic equipment and, in particular, to a system for securing an electronic device, such as a solid state drive, in a high-vibration environment.

BACKGROUND OF THE INVENTION

Modern locomotives typically include on-board electronics to monitor and control their various systems, such as, for example, their traction, engine, and braking systems. The electronics often include one or more processors coupled to a mass data storage system via a bus interface. These interconnected components are all stored within the locomotive, which raises several potential considerations.

In particular, locomotives may present a high-vibration environment due to track irregularities and the like. Moreover, locomotives may encounter relatively extreme temperatures along their path of travel. As will be appreciated, on-board electronics are exposed to these conditions.

Additionally, the on-board electronics often include components that are not easily removed. For example, the electronics typically include a mass storage device such as a solid-state drive (SSD). As will be appreciated, it may be desirable to easily and quickly remove such devices for service or replacement. Removal, however, often requires the use of tools and is relatively labor and time intensive.

Furthermore, on-board electronics often include a bus interface, such as a Serial ATA (SATA) interface. SATA interfaces include mating portions that feature pins and contact fingers. It is generally desirable to provide a secure and tight connection between such mating portions to reduce the possibility of fretting corrosion.

It is also desirable to provide a mass storage device that includes a mating portion that is not easily damaged during handling as a result of electrostatic discharge.

BRIEF DESCRIPTION OF THE INVENTION

According to one embodiment of the present invention, an apparatus for securing electronic equipment includes an electronic device having a first mating portion. ("Mating portion" refers to one or more electrical connectors for external electrical communications with the electronic device, and possibly including mechanical support and alignment features.) The device is removably secured within a shell, which has an open end allowing access to the first mating portion. The apparatus further includes a dock having a second mating portion and an output connector in electrical communication with the second mating portion. The dock removably receives the shell to facilitate electrical communication between the first and second mating portions. The output connector facilitates electrical communication between the electronic device and a device external to the dock. The apparatus further includes a damping mechanism to reduce vibratory forces on the first and second mating portions and relative movement between the portions.

According to another embodiment of the present invention, an apparatus for securing a mass data storage device in a high-vibration environment includes a mass data storage device having a first mating portion. The storage device is removably secured within a shell. The shell includes a grip portion as well as an open end allowing access to the first mating portion, which is set back from the open end. The apparatus further includes a locator hole in the shell and a dock having a second mating portion. The dock also includes an output connector in electrical communication with the second mating portion. The dock removably receives the shell to facilitate electrical communication between the first and second mating portions. The output connector facilitates electrical communication between the electronic device and a device external to the dock. The apparatus further includes at least one guide located on the dock. The guide receives the shell and defines a path of travel for the shell in which the first and second mating portions are in mating alignment. Further, the apparatus includes at least one locator pin on the dock wherein the locator pin and hole facilitate proper mating alignment between the first and second mating portions. Finally, the apparatus includes a gasket located between the open end of the shell and the dock. The gasket reducing vibratory forces on the first and second mating portions and relative movement between the portions.

Yet another embodiment of the inventive apparatus is a system for securing an SSD in a locomotive. The system includes an SSD having a first SATA connector portion. The SSD is removably secured within a shell having a grip portion as well as an open end allowing access to the first SATA connector portion, which is set back from the open end. The apparatus further includes a plurality of locator holes in the shell. The holes are located on opposite sides of the first SATA connector portion. Further, the apparatus includes a dock having a second SATA connector portion and an IDE connector in electrical communication with the second SATA connector portion. The dock removably receives the shell to facilitate electrical communication between the first and second SATA connector portions. The IDE connector facilitates electrical communication between the SSD and a device external to said dock. The apparatus also includes a plurality of guides located on the dock, which receive the shell and define a path of travel for the shell in which the first and second SATA connector portions are in mating alignment. The apparatus also includes a plurality of locator pins on the dock wherein the locator pins and holes facilitate proper mating alignment between the first and second mating portions. A gasket is located between the open end of the shell and the dock. The gasket reduces vibratory forces on the first and second SATA connector portions and relative movement between the portions. As used in any of the embodiments described herein, "facilitates" electrical communication means establishing electrical communication under certain conditions, e.g., proper alignment and connection of the mating or connector portions or other connectors.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Figure 1:
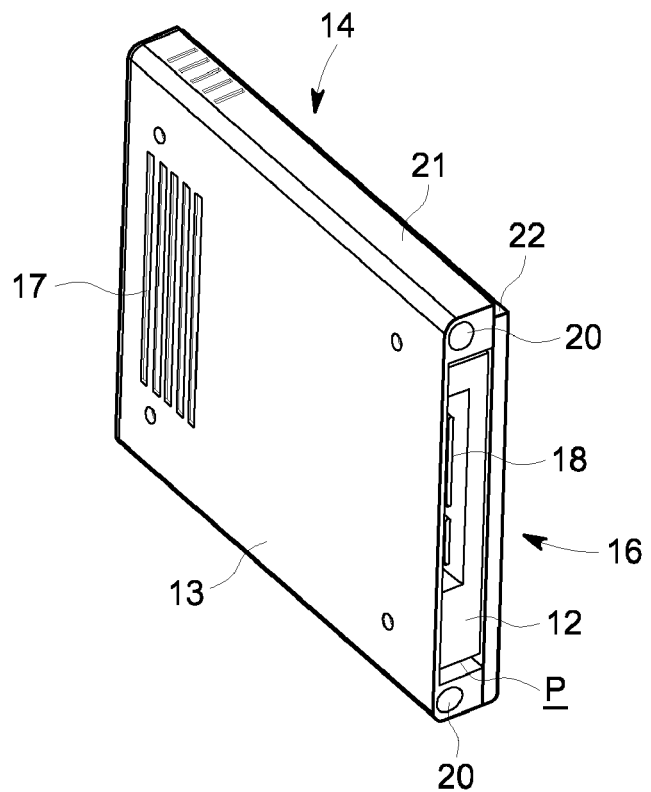
FIG. 1 is an isometric view of a shell in accordance with an embodiment of the inventive apparatus for securing electronic equipment.

Reference will be made below in detail to exemplary embodiments of the invention, examples of which are illustrated in the accompanying drawings. Wherever possible, the same reference numerals used throughout the drawings refer to the same or like parts.

As described in detail below, an embodiment of the present invention provides an apparatus for securing electronic equipment in a high vibration environment that is easy to use, robust, and tamper resistant. Embodiments of the inventive apparatus include beneficial damping, alignment, and heating features, as well as secure mating connectors.

Referring generally to FIGS. 1-17, an embodiment includes a shell 14 that contains the electronic device to be secured. The shell 14 is removably fixed within a dock 30. A hinged external housing 60 is fastened to the dock 30 to isolate and further protect both the shell 14 and dock 30.

Figure 2:
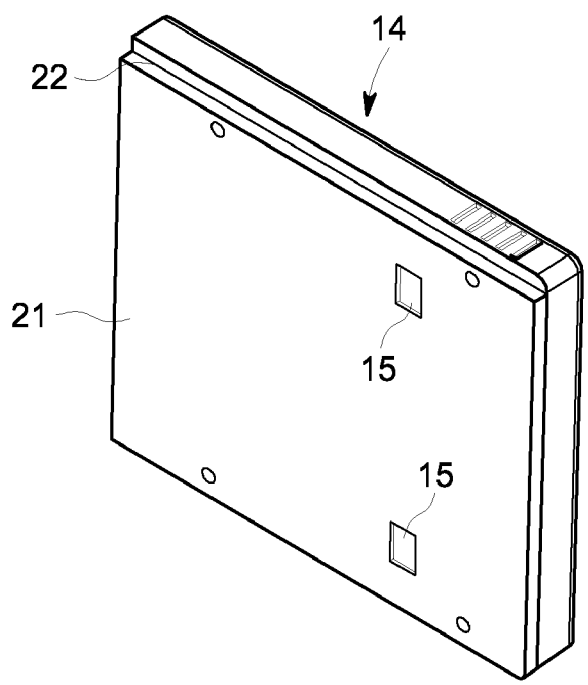
FIG. 2 is an isometric view the shell of FIG. 1 depicting a reverse side of the shell.

More specifically, and as shown in FIGS. 1 and 2, the shell 14 contains the electronic equipment, which may be a mass data storage device or drive 12, such as an SSD. As will be appreciated, the drive 12 is configured for the storage of data and includes a first mating portion 18, such as an SATA connector plug, that facilitates the attachment of the drive 12 to a motherboard/processor (not shown).

The drive 12 is removably secured within the shell 14, which includes a shell base 21 and lid 13. In use, the drive 12 is placed within the shell base 21 and the lid 13 is then secured to both the drive 12 and shell base. The shell 14 protects the drive 12 and facilitates its quick, tool-less insertion and removal, as described in greater detail below.

As depicted, the shell 14 has a connector end 16 that is at least partially open. The drive 12 is positioned within the shell 14 such that its first mating portion 18 faces the open end 16 so that the first mating portion 18 is accessible. In particular, the mating portion 18 is recessed in the shell 14 and set back from a plane P defined by the open connector end 16. The mating portion 18 is recessed within the shell 14 to protect it from potential electrostatic discharge.

Figure 5:
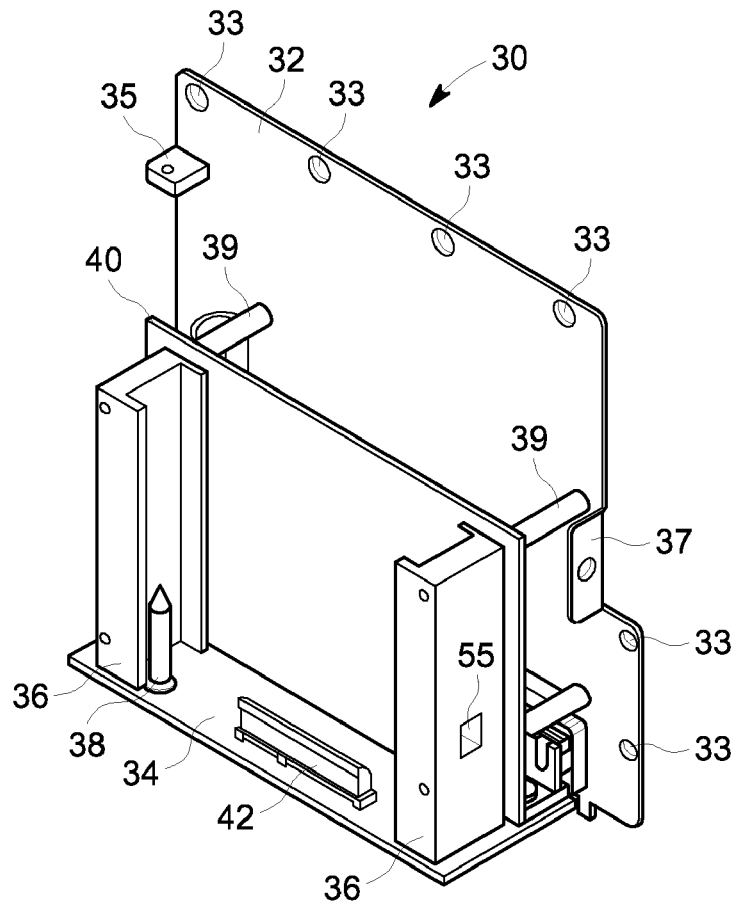
FIG. 5 is an isometric view of a dock in accordance with an embodiment of the inventive apparatus for securing electronic equipment.

The shell 14 further includes two locating holes 20 on opposite sides of the connector end 16. The holes are configured to receive locator pins 38 (FIG. 5) which are used to align the first mating portion 18 when the shell 14 is inserted into the dock 30 (FIG. 5).

In addition to the locating holes 20, the shell 14 includes a notched edge 22, which as discussed below, serves as a key to ensure that the shell 14 is inserted into the dock 30 in the correct orientation. The shell 14 may also include one or more detents 15 which are configured to receive a biasing mechanism in the dock 30, such as a flat spring, to provide positive feedback indicating complete and proper insertion of the shell 14 into the dock 30. Moreover, the lid 13 has a grip portion 17 (e.g., series of alternating ridges and detents, a textured surface, or the like) to facilitate insertion and removal.

Figure 3:
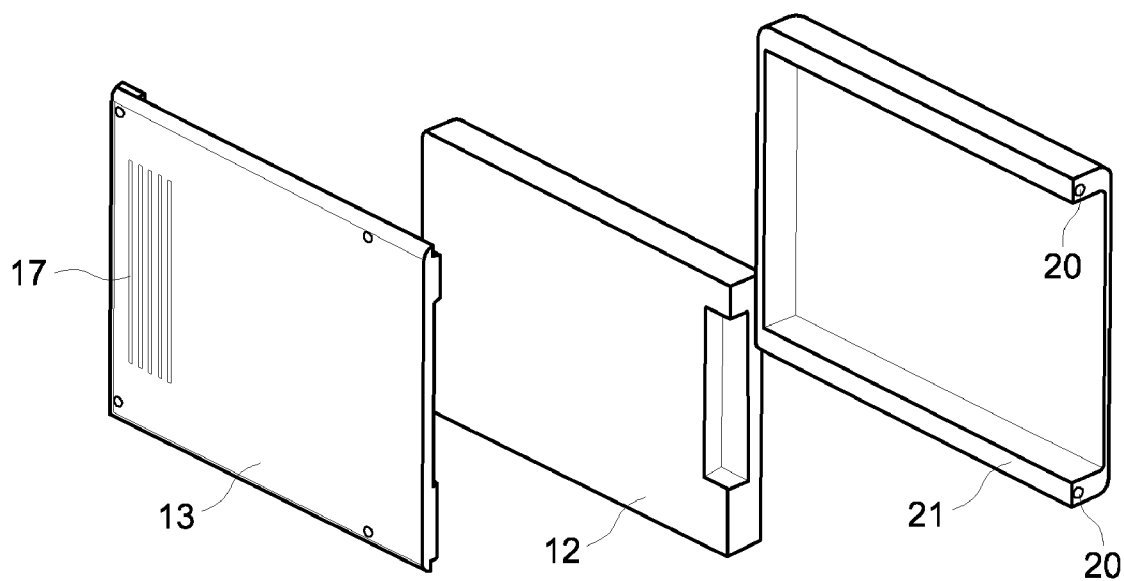
FIG. 3 is an exploded isometric view of the shell of FIG. 1.

Referring now to FIG. 3, an exploded view of an embodiment of the inventive shell 14 is depicted. As shown, the drive 12 fits within the shell base 21 and a lid 13 is secured to the shell base 21 and drive 12. While the depicted embodiment illustrates the shell base 21 with a separate lid 13, it will be appreciated that it may also be possible to utilize a unitary shell.

Figure 4:
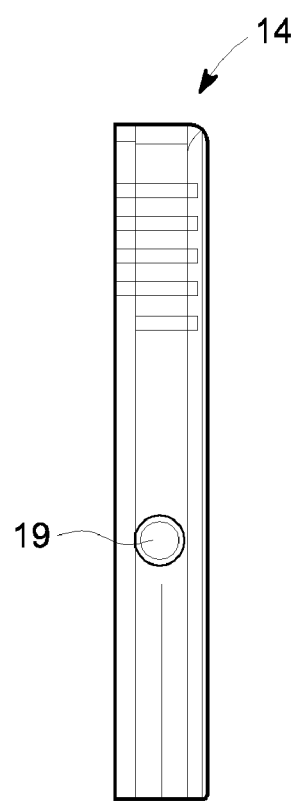
FIG. 4 is a side view of the shell of FIG. 1.

As shown in FIG. 4, the shell 14 may also include a plunger recess 19, which receives a spring biased plunger 51 (FIG. 9) to lock the shell 14 in the dock 30. The plunger recess 19 and plunger 51 allow the shell 14 to be quickly locked and unlocked without the use of a tool.

Turning now to FIGS. 5-9, an embodiment of the inventive dock 30 is depicted. The dock 30 generally includes a base portion 32, a printed circuit board (PCB) 34 attached to the base portion 32, a plurality of guides 36 and locator pins 38, and a heating element 40.

Figure 6:
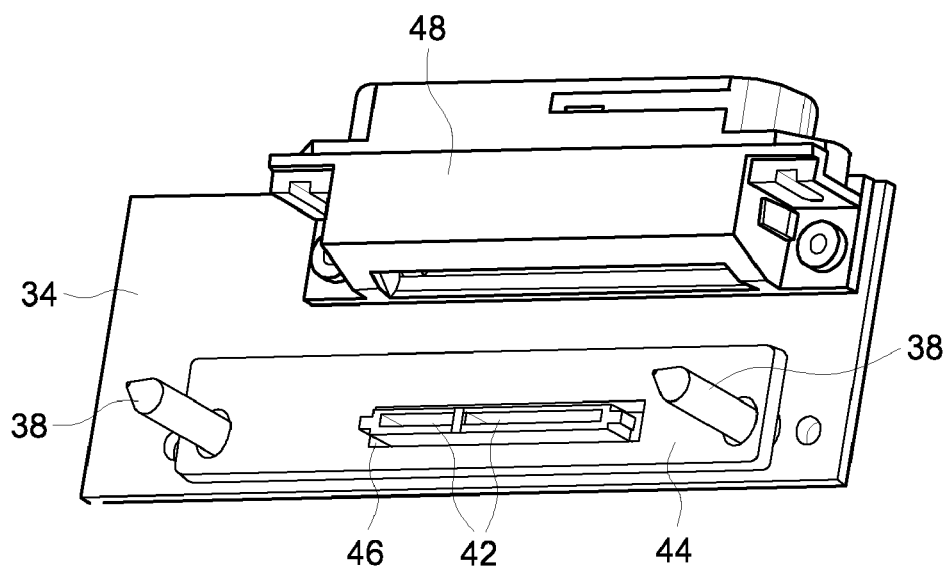
FIG. 6 is an isometric view of a PCB of the dock of FIG. 4.

FIG. 6 illustrates the PCB 34 in greater detail. In particular, the PCB 34 includes a second mating portion 42 that interconnects with the first mating portion 18 of the drive 12. As shown, the second mating portion 42 can, for example, include a female SATA connector, e.g., SATA power and data connectors.

The PCB 34 further includes a damping mechanism such as, for example, a sealing gasket 44 that is placed over the locator pins 38. The gasket 44 has an opening 46 that surrounds the second mating portion 42 such that the first and second mating portions 18, 42 may be connected. The gasket opening 46 is configured to receive the first mating portion 18 of the drive 12 when the shell 14 is mounted to the dock 30. The gasket 44 is compressible and absorbs vibratory force on the interconnected first and second mating portions 18, 42 as well as protects the drive 12 from environmental conditions.

The PCB further includes an output connector 48, which is in electrical communication with the second mating portion 42 via circuitry on the PCB (e.g., a plurality of conductive pathways, tracks, or traces etched from copper sheets laminated onto a non-conductive substrate of the PCB). The output connector 48 may be, for example, any high speed parallel or serial, electrical or optical connector, such as an IDE connector. In any event, the output connector 48 facilitates communication between the drive 12 and an external processor/motherboard via the interconnected first and second mating portions 18, 42.

Figure 7:
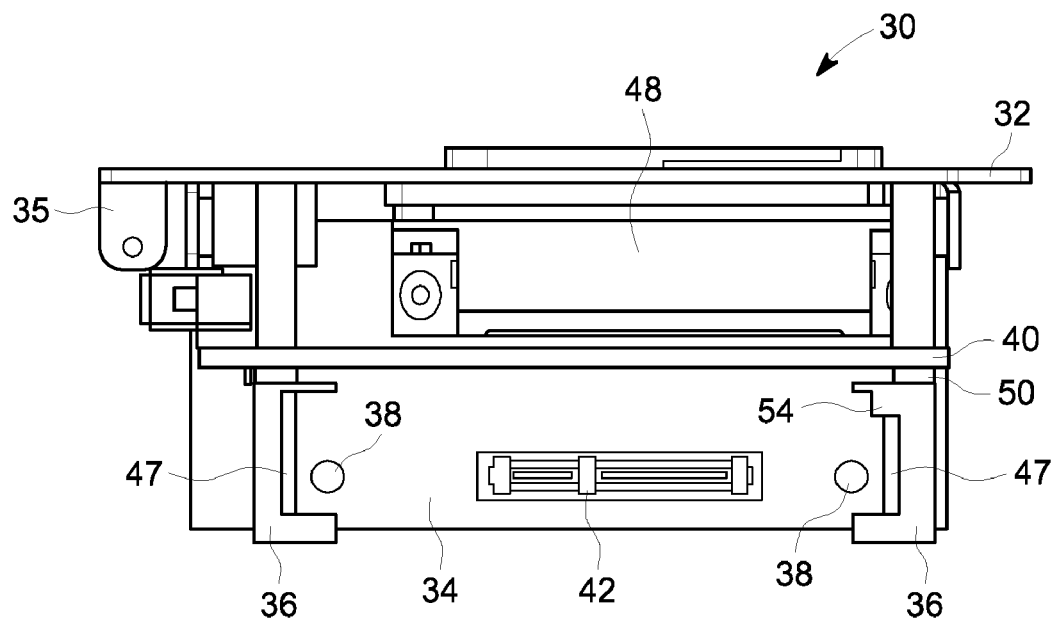
FIG. 7 is a top view of the dock of FIG. 4.

Turning now to FIGS. 5 and 7, the dock 30 includes two guides 36 which are, as shown, mounted to the PCB and have a substantially U-shaped cross-section. The guides 36 are positioned on opposite sides of the PCB in relatively close proximity to the locator pins 38. The guides 36 define and limit the path of travel of the shell 14 during insertion of the shell 14 into the dock 30. Thus, the distance between the facing channel portions of the guides 36 may correspond to the width of the shell 14.

An embodiment may also include a key mechanism that allows a user to insert the shell 14 into the dock 30 in only one orientation. As shown in FIG. 7, the key mechanism can include a ridged surface 54 on one of the guides 36 that engages the notched edge 22 of the shell 14 (FIG. 1). As will be appreciated, the notched edge 22 and surface 54 are designed to function as a key wherein they are alignment when the shell 14 is in a orientation sufficient for mating inter-engagement with the dock 30. In other words, the edge 22 and ridged surface 54 prevent the improper insertion of the shell 14 into the dock 30.

The guides 36 may optionally have a chamfered edge 47, located at the leading ends of the guides where the shell is inserted, to facilitate insertion of the shell 14 into the dock 30.

Figure 9:
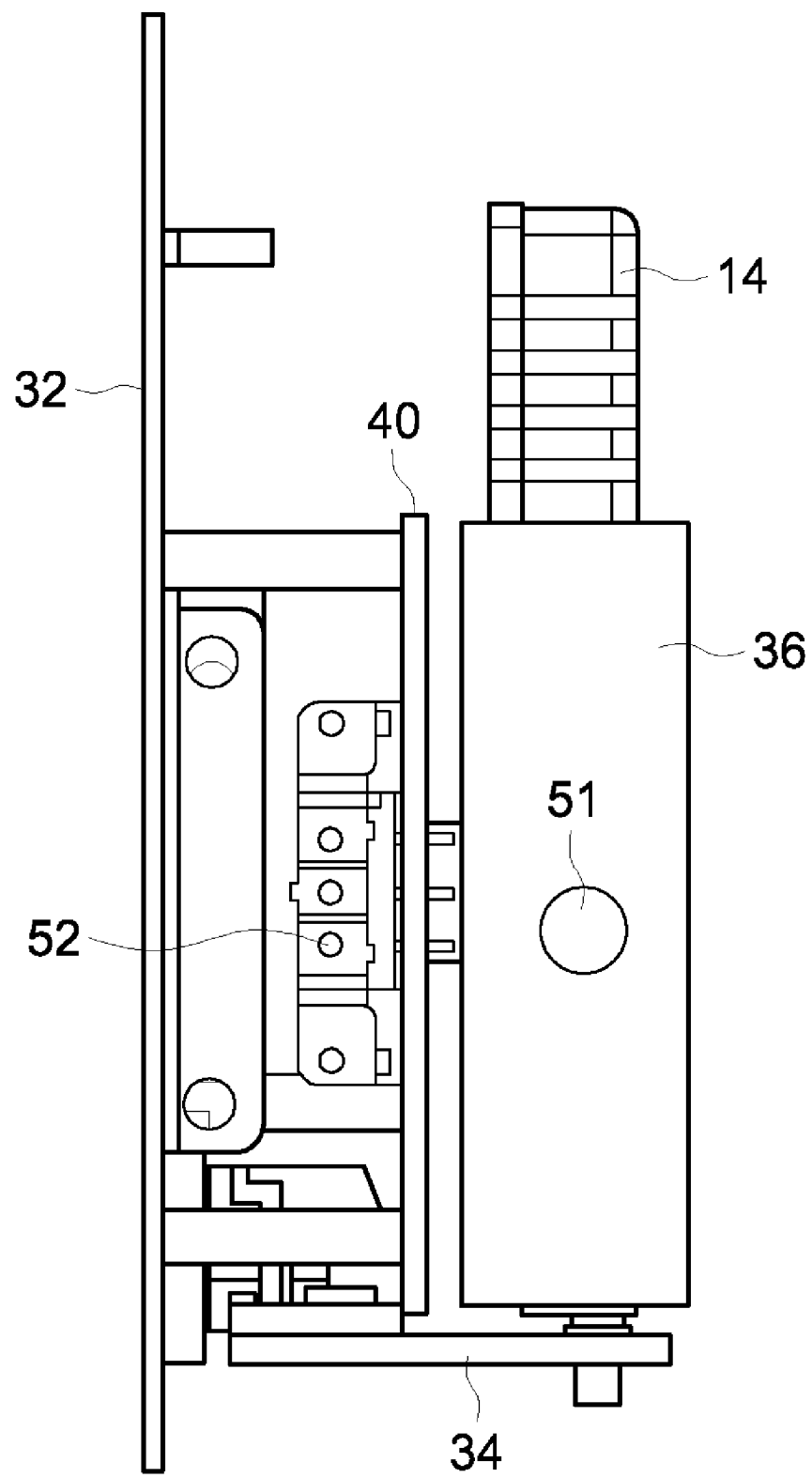
FIG. 9 is a side view of the dock of FIG. 4 illustrating the insertion of the shell of FIG. 1 within the dock.

The dock 30 also features a heating element 40 such as, for example, a PCB heater. The heating element 40 may be connected to a control or regulatory mechanism such as a thermistor. The heating element 40 is spaced apart from the shell 14 through the use of a spacer 50. The heating element 40 is connected to an external power source (not shown) via a connector 52 (FIG. 9). For example, the heating element 40 may be connected to a 74 VDC battery. As will be appreciated, the heating element 40 protects the shell 14 from environmental conditions encountered during use, i.e., extremely low temperatures.

As stated, the PCB 34 includes locator pins 38, e.g., two locator pins. The pins 38 are configured to enter the locating holes 20 when shell 14 is inserted into the dock 30. In this manner, the pins 38 ensure that the shell 14 and dock 30 are aligned such that the first and second mating portions 18, 42 may be urged together into communication with one another. The pins 38 also ensure that a different drive, i.e., one without properly spaced locating holes, may not be substituted for the inventive drive 12. This allows a great degree of control over on-board data storage electronics.

Figure 8:
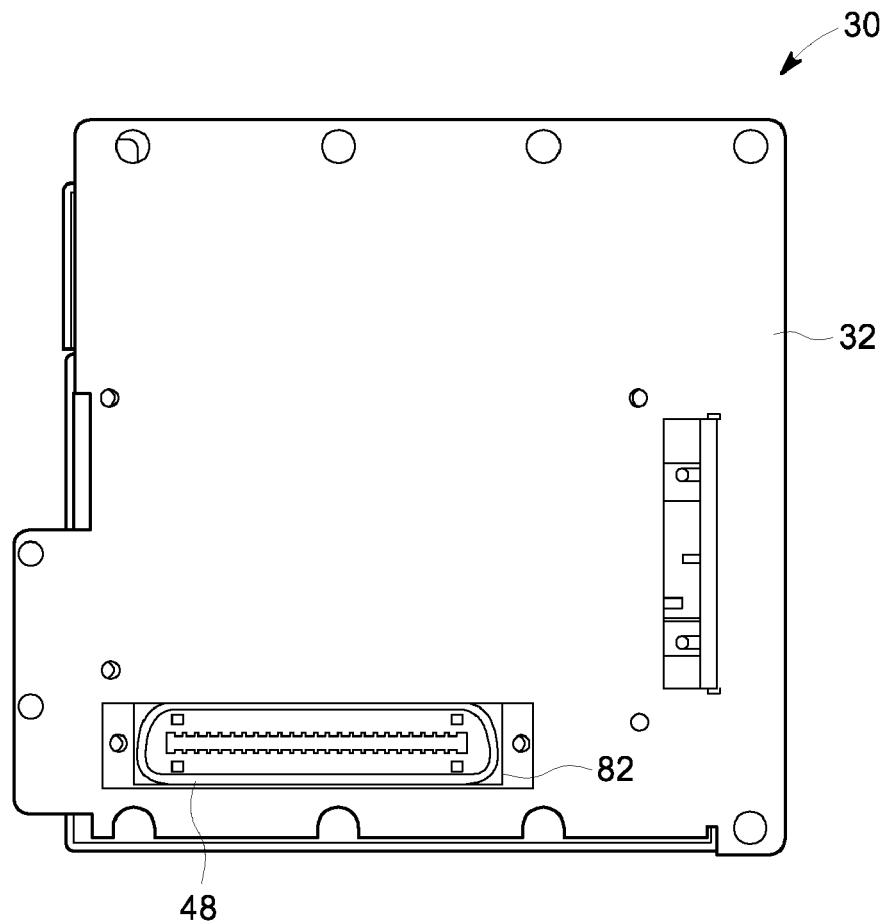
FIG. 8 is a rear view of the dock of FIG. 4.

In an embodiment, the output connector 48 is mounted to the PCB 34 at a right angle from the second mating portion 42. In this orientation, the output connector 48 is accessible from the back of the base 32 (FIG. 8). As such, a CPU/motherboard may be connected to the output connector 48 and the base 32 may then be secured to a surface via fasteners (not shown) thereby providing a physically stable environment for the output connector 48 to CPU interconnection.

As shown in FIG. 9, when the shell 14 is inserted into the guides 36, and the first and second mating portions 18, 42 are in engagement, the plunger 51 is biased into the plunger recess 19 securing the shell 14 in the dock 30. In use, the shell 14 may be easily and quickly removed from the guides 36 and dock 30 by urging the plunger 51 out of the plunger recess 19, and then pulling the shell 14 out of the guides 36. The plunger 51 is spring-biased and may be accessed to remove the shell 14 when the external enclosure 60 is not secured to the dock 30.

Referring back to FIG. 5, the base 32 includes a series of holes 33 which receive fasteners to secure the dock 30 to a static surface, e.g., a vehicle bulkhead. The base 32 further includes a tab 35 that may be used to lock a lid of the external enclosure 60 thwarting unauthorized access to the shell 14 and drive 12. The base 32 may also contain tabs 37 that allow the external enclosure 60 to be removably secured thereto. Additionally, the guides 36 and heating element 40 are set off away from the base 32 through the use of spacers 39. Finally, the back of the base 32, shown in FIG. 8, includes an opening 82 through which the connector 48 may be accessed.

Referring now to FIGS. 10-16, an embodiment of the inventive apparatus includes an external housing 60 that is removably secured to the dock 30. As will be appreciated, the housing 60 protects the dock 30 and the shell 14 secured within. The external housing 60 includes a lid 62 that is secured to a lower portion 64 via a hinge 66. The external housing 60 has an open back portion 61 which allows the housing 60 to be placed over the PCB board 34 of the dock 30, including any shell 14 mounted thereon, and, when secured to or against the base 32 of the dock 30, forms a complete, six-sided enclosure around the PCB board 34 and shell 14. The external housing 60 may be secured to the base 32 of the dock 30 via conventional fasteners, which may be received in tabs 37, for example (FIG. 5).

The lower portion 64 of the enclosure 60 may further include a top surface 65 that features a slot 67 that is in alignment with the guides 36 of the dock within the enclosure 60. The slot 67 is configured to receive the shell 14, which may be slid into the slot 67 and into the guides 36 to connect the mating portions 18, 42.

Figure 10:
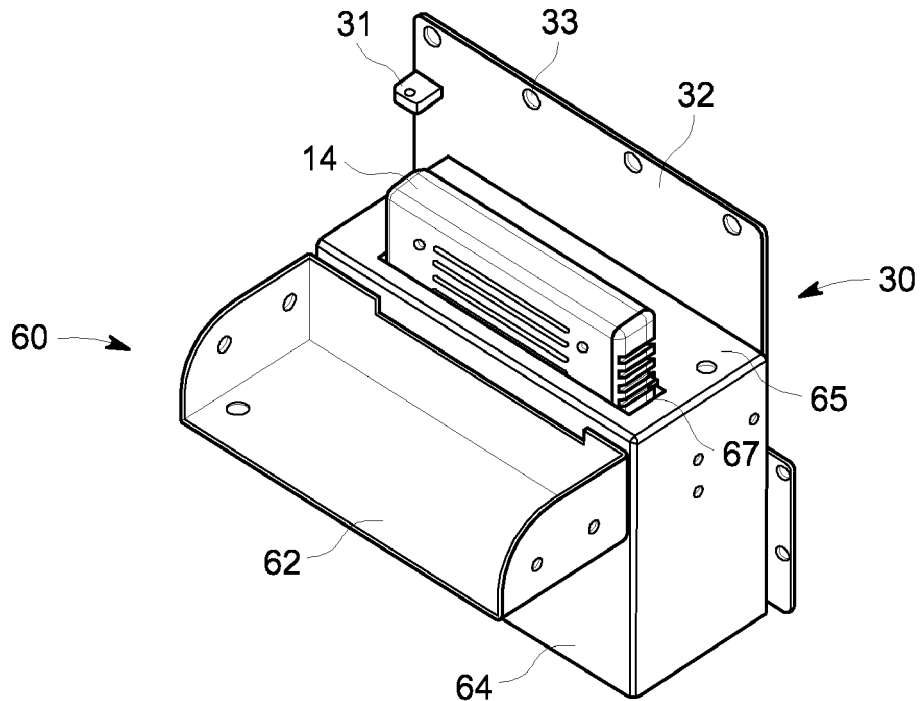
FIG. 10 is an isometric view of an external housing in accordance with an embodiment of the inventive apparatus for securing electronic equipment.
Figure 11:
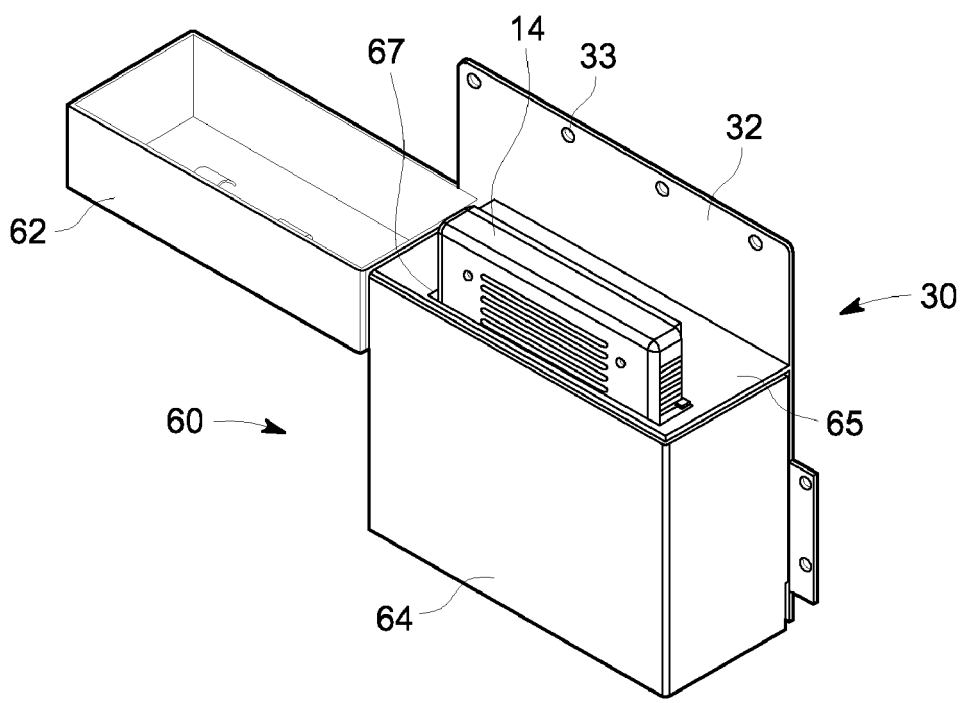
FIG. 11 is an isometric view of an external housing in accordance with an alternative embodiment of the inventive apparatus for securing electronic equipment.

As stated, the external housing 60 includes a lid 62 that is hingedly attached to its lower portion 64. The hinge 66 may be located on a front surface of the lower portion 64, as shown in FIG. 10, or, alternatively, may be located on a side surface of the lower portion as depicted in FIG. 11.

Figure 12:
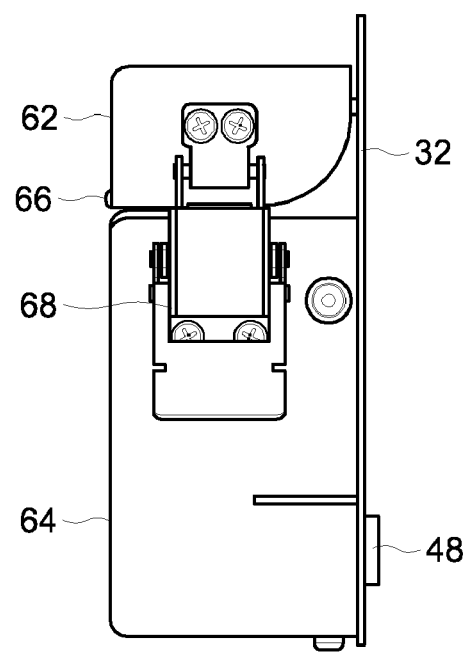
FIG. 12 is side view of the external housing of FIG. 10.
Figure 13:
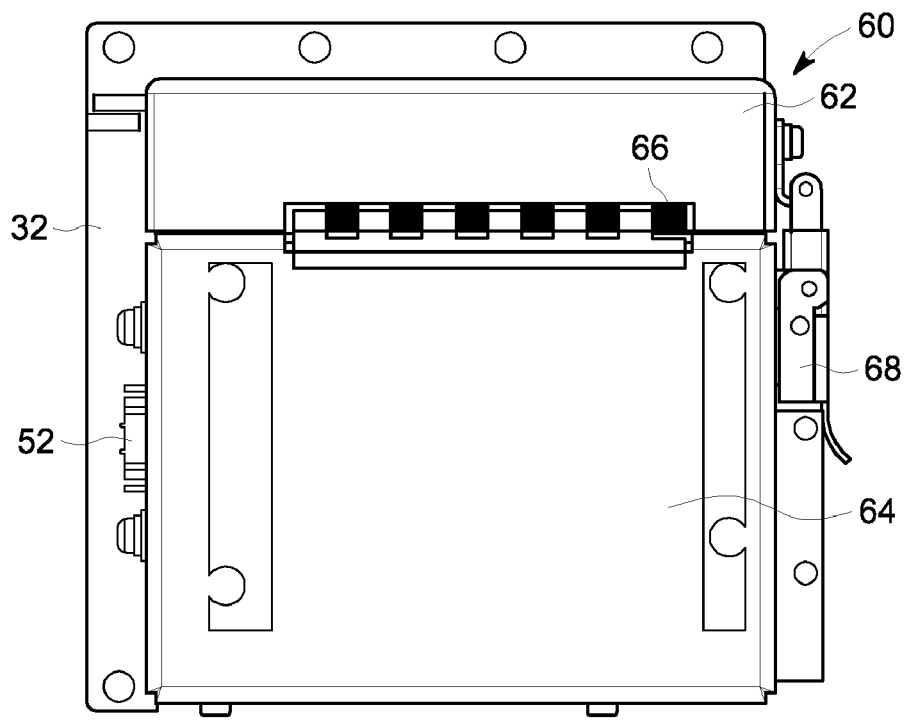
FIG. 13 is a front view of the external housing of FIG. 10.

With either hinge location, the enclosure 60 further includes a locking mechanism to secure the lid 62 to the lower portion 64. As shown in FIG. 12, the locking mechanism may include a latch assembly 68 fixed to the lid 62 and lower portion 64. The locking mechanism may alternatively include one or more thumbscrews 70 which extend through the lid 62 and into threaded receptacles 72 fixed to the interior of the housing 60 (FIGS. 14 and 15).

As will be appreciated, the locking mechanism is configured such that the lid 62 may be easily and quickly unlocked to access the dock 30 and shell 14.

Figure 14:
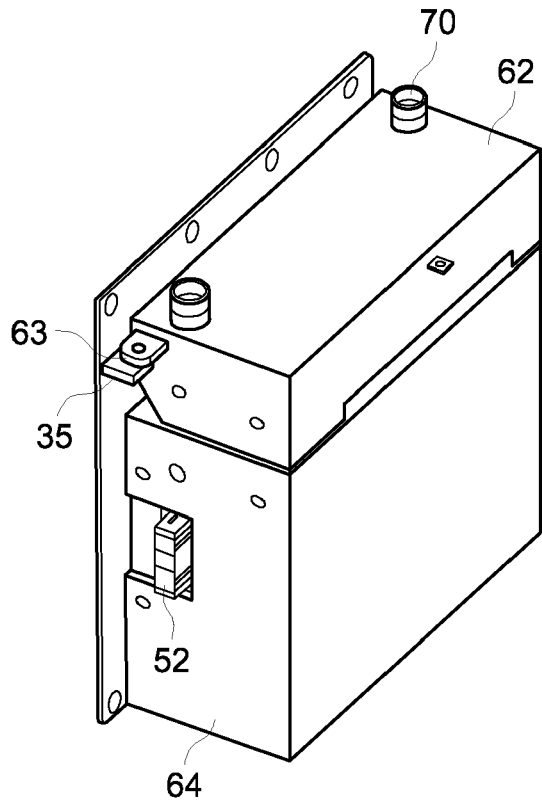
FIG. 14 is an isometric view of the external housing of FIG. 10 depicting an alternative lid locking mechanism.
Figure 15:
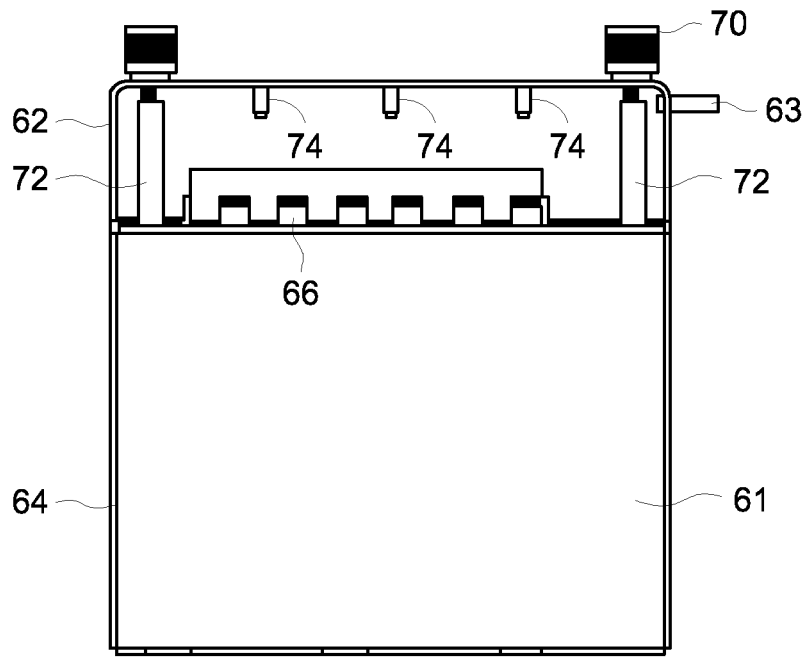
FIG. 15 is a rear view of the external housing and lid locking mechanism of FIG. 14.

Moreover, the lid 62 may include a tab 63 having an aperture (FIG. 14). When the lid 62 is closed the tab 63 is in substantial alignment with tab 35 such that, for example, the shackle of a padlock may be passed through both apertures to lock the lid 62 to the lower portion 64 should such security be desired.

Figure 16:
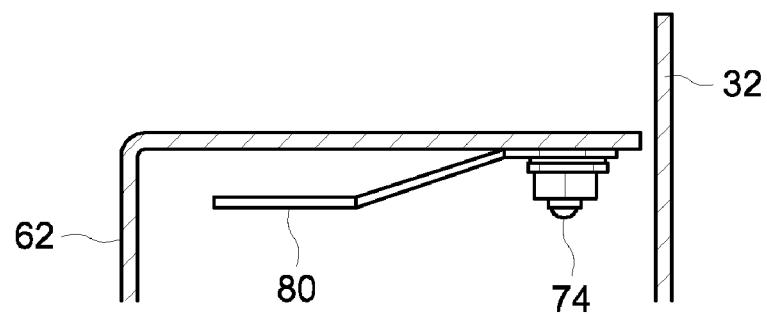
FIG. 16 is a cut-away view of a biasing mechanism in accordance with an embodiment of the inventive apparatus for securing electronic equipment

As shown in FIG. 16, the lid 62 may also include a biasing mechanism 80, such as a flat spring, that extends downward from an interior upper surface of the lid 62. The biasing mechanism 80 may be secured to the lid 60 through one or more threaded fasteners 74 or the like (FIGS. 15, 16).

When the lid 62 is closed, the biasing mechanism 80 contacts an upper portion of the shell 14 urging the shell 14 downward to form a tight fit between the first and second mating portions 18, 42. As such, the possibility of fretting corrosion, i.e., corrosion damage at the asperities of contact surfaces due to relative surface movement, is reduced.

Figure 17:
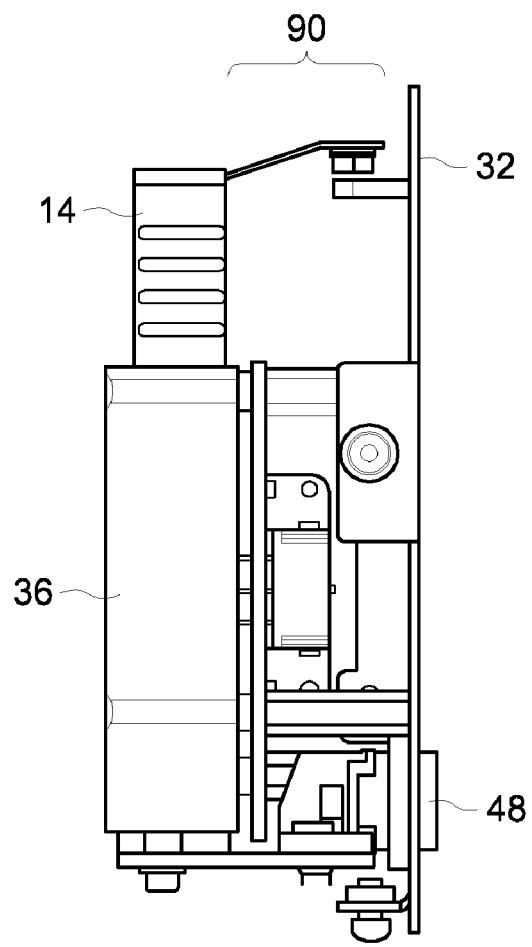
FIG. 17 is a side view of an alternative embodiment of the biasing mechanism of FIG. 16.

FIG. 17 illustrates an alternative biasing mechanism 90 in which, for example, a flat spring may be mounted to the base 32 of the dock 30. This alternative may be employed in installations in which an external enclosure 60 is not employed.

In use, an embodiment of the inventive apparatus may include an electronic device having a first mating portion that is removably secured with a shell. The shell, in turn, is removably received in a dock that includes a second mating portion as well as an output connector and a damping mechanism. In certain circumstances, this embodiment may omit the above-referenced external housing without departing from the spirit and scope of invention.

In other embodiments, the apparatus may include, in addition to the above, an alignment mechanism, guides, chamfered edge portions, locator pins and holes, a notched shell edge in combination with a ridged guide surface, a heating element, a grip portion, a set back first mating portion, a detent, and/or a biased plunger, either alone or in combination. Moreover, if included, the external housing may have a lid and lower portion, a hinge, a biasing mechanism in or on the lid, and/or first and second locking mechanisms.

In yet other embodiments, the electronic device may be a storage drive such as an SSD. The first and second mating portions may be SATA connectors and the output connector may be an IDE connector. It may also be desirable to include a biasing mechanism on the dock itself.

In an embodiment, the SSD or other mass data storage device is used to store (i) operations data generated during running of a vehicle, such as vehicle parameter data, event recorder data, and recorded video data; and/or (ii) data that is used for operating the vehicle, such as route data or a route database.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "third," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable any person skilled in the art to practice the embodiments of invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus for securing an electronic device, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus for securing electronic equipment, said apparatus comprising:
    an electronic device having a first mating portion, said electronic device being removably secured within a shell, said shell having an open end allowing access to said first mating portion;
    a dock having a second mating portion and an output connector in electrical communication with said second mating portion, said dock removably receiving said shell to facilitate electrical communication between said first and second mating portions, and said output connector facilitating electrical communication between said electronic device and a device external to said dock; and
    a damping mechanism to reduce vibratory forces on said first and second mating portions and relative movement between said portions, said damping mechanism including a gasket located between said open end of said shell and said dock and having an opening surrounding said second mating portion and configured to receive said first mating portion enabling said electrical communication between said first and second mating portions.

2. The apparatus of claim 1 wherein said apparatus further comprises:
    an alignment mechanism for ensuring proper alignment between said shell and said dock and reducing relative movement between said shell and dock.

3. The apparatus of claim 2 wherein said alignment mechanism comprises:
    at least one locator pin on said dock;
    at least one locator hole in said shell, said locator hole configured to receive said locator pin; and
    wherein said locator pin and hole facilitate proper mating alignment between said first and second mating portions and hold said shell in place while said first and second mating portions are interconnected.

4. The apparatus of claim 2 wherein said alignment mechanism includes at least one guide on said dock; and
    wherein said at least one guide receives said shell and defines a path of travel for said shell within said dock in which said first and second mating portions are in mating alignment, said guide also holds said shell in place while said first and second mating portions are interconnected.

5. The apparatus of claim 4 wherein said at least one guide further comprises:
    a biased plunger that extends into a plunger hole in said shell to removably lock said shell in said guide.

6. The apparatus of claim 4 wherein said at least one guide has a chamfered edge portion facilitating insertion of said shell into said guide.

7. The apparatus of claim 4 wherein said alignment mechanism comprises:
    a notched edge portion on said shell;
    a ridged surface on said at least one guide; and
    wherein said notched edge portion must be aligned and inter-engaged with said ridged surface of said guide in order for said shell to be inserted into and received by said dock.

8. The apparatus of claim 1 wherein said apparatus further comprises:
    a heating element to heat said shell and said electronic device during adverse environmental conditions.

9. The apparatus of claim 1 wherein said apparatus further comprises:
    an external housing removably fixed to said dock, said housing allowing selective access to said shell for removal or insertion of said shell into said dock and access to said output connector, said housing including a biasing mechanism which urges said first and second mating portions together when said housing is fixed to said dock.

10. The apparatus of claim 1 wherein said shell includes a grip portion to facilitate insertion of said shell into said dock and removal of said shell from said dock.

11. The apparatus of claim 1 wherein said first mating portion is set back from a plane defined by said open end of said shell.

12. The apparatus of claim 1 wherein said shell includes at least one detent configured to receive a biasing mechanism when said shell is properly inserted into said dock and that first and second mating portions are in mating inter-engagement.

13. An apparatus for securing a mass data storage device in a high-vibration environment, said apparatus comprising:
   a mass data storage device having a first mating portion, said storage device being removably secured within a shell, said shell having a grip portion as well as an open end allowing access to said first mating portion, said first mating portion being set back from said open end;
   a locator hole in said shell;
   a dock having a second mating portion and an output connector in electrical communication with said second mating portion, said dock removably receiving said shell to facilitate electrical communication between said first and second mating portions, and said output connector facilitating electrical communication between said storage device and a device external to said dock;
   at least one guide located on said dock, said guide receives said shell and defines a path of travel for said shell in which said first and second mating portions are in mating alignment;
   at least one locator pin on said dock wherein said locator pin and hole facilitate proper mating alignment between said first and second mating portions;
   a gasket located between said open end of said shell and said dock, said gasket reducing vibratory forces on said first and second mating portions and relative movement between said portions, said gasket having an opening surrounding said second mating portion and configured to receive said first mating portion; and
   an external housing removably fixed to said dock, said housing allowing selective access to said shell for removal or insertion of said shell into said dock and access to said output connector, said external housing including a lower portion, a lid hingedly connected to said lower portion and allowing selective access to said shell, and a locking mechanism to secure said lid to said lower portion;
   wherein said lid has an inner surface that includes a biasing mechanism that urges said first and second mating portions together when said lid is secured to said lower portion of said external housing.

14. The apparatus of claim 13 wherein said apparatus further comprises:
   a notched edge portion on said shell;
   a ridged surface on an inner surface of said at least one guide; and
   wherein said notched edge portion must be aligned and inter-engaged with said ridged surface of said guide in order for said shell to be inserted into and received by said dock.

15. The apparatus of claim 13 wherein said dock further comprises:
   a heater board for heating said shell and said mass data storage device during adverse environmental conditions.

16. The apparatus of claim 13 wherein said locking mechanism is a latch assembly.

17. The apparatus of claim 13 wherein said locking mechanism is at least one thumbscrew.

18. The apparatus of claim 13 wherein said external housing includes a second locking mechanism to secure said external housing to said dock.

19. The apparatus of claim 13 wherein said dock includes a biasing mechanism that contacts an upper surface of said shell to urge said first and second mating portions together.

20. A system for securing an SSD in a locomotive, said system comprising:
   an SSD having a first SATA connector portion, said SSD being removably secured within a shell, said shell having a grip portion as well as an open end allowing access to said first SATA connector portion, said first SATA connector portion being set back from said open end;
   a plurality of locator holes in said shell, said holes being located on opposite sides of said first SATA connector portion;
   a dock having a second SATA connector portion and an IDE connector in electrical communication with said second SATA connector portion, said dock removably receiving said shell to facilitate electrical communication between said first and second SATA connector portions, and said IDE connector facilitating electrical communication between said SSD and a device external to said dock;
   a plurality of guides located on said dock, said guides receiving said shell and defining a path of travel for said shell in which said first and second SATA connector portions are in mating alignment;
   a plurality of locator pins on said dock wherein said locator pins and holes facilitate proper mating alignment between said first and second mating portions;
   a gasket located between said open end of said shell and said dock and having an opening surrounding said second SATA connector portion and configured to receive said first SATA connector portion, said gasket reducing vibratory forces on said first and second SATA connector portions and relative movement between said portions; and
   an external housing removably fixed to said dock, said housing allowing selective access to said shell for removal or insertion of said shell into said dock and access to said output connector, said external housing including a lower portion, a lid hingedly connected to said lower portion and allowing selective access to said shell, said lid having an inner surface with a flat spring that contacts an upper surface of said shell to urge together said first and second SATA connector portions when said lid is secured to said lower portion, and a locking mechanism to secure said lid to said lower portion.

* * * * *